United States Patent
Shibata

(12) 
(10) Patent No.: US 6,181,188 B1
(45) Date of Patent: Jan. 30, 2001

(54) APPARATUS FOR STABILIZING TRANSMISSION OUTPUT

(75) Inventor: Manabu Shibata, Sendai (JP)

(73) Assignee: Fujitsu Limited, Kanagawa (JP)

( * ) Notice: Under 35 U.S.C. 154(b), the term of this patent shall be extended for 0 days.

(21) Appl. No.: 09/136,004

(22) Filed: Aug. 18, 1998

(30) Foreign Application Priority Data

Mar. 25, 1998 (JP) ................................. 10-076844

(51) Int. Cl.$^7$ ....................................................... H03L 5/00
(52) U.S. Cl. ............................................................. 327/331
(58) Field of Search ............................... 327/331, 18–20, 327/26, 27, 41, 46, 47; 455/9, 24, 69, 75–78, 522

(56) References Cited

U.S. PATENT DOCUMENTS

| | | | |
|---|---|---|---|
| 5,396,652 | * 3/1995 | Kunitomo | 455/75 |
| 5,566,363 | 10/1996 | Haruyasu . | |
| 5,697,074 | 12/1997 | Hannu et al. . | |
| 5,752,171 | * 5/1998 | Akiya | 455/126 |
| 5,768,694 | * 6/1998 | Kumagai | 455/126 |
| 5,854,971 | * 12/1998 | Nagoya et al. | 455/126 |
| 5,995,811 | * 11/1999 | Watanabe | 455/115 |

FOREIGN PATENT DOCUMENTS 681 375  11/1995 (EP) .
786 859   7/1997 (EP) .

\* cited by examiner

Primary Examiner—My-Trang Nu Ton
(74) Attorney, Agent, or Firm—Helfgott & Karas, P.C.

(57) ABSTRACT

An apparatus stabilizes the level of an output signal (b) of an output control unit (1) according to a control signal (c). When a power source is turned on or when burst signal transmission starts, an input signal (a) to the output control unit (1) rises. While the input signal (a) is rising, a switching circuit (6) selects initial value data (e) held in an initial value data holding circuit (8), so that a smoothing unit (4) may generate the control signal (c) from the initial value data (e). When a variation in difference data obtained from a moving average of the difference between level data (h) detected by a level detecting unit (3) and reference value data (g) held in a reference value data holding circuit (9) decreases below a predetermined value, the switching circuit (6) provides the difference data as average value data (f) to the smoothing unit (4) so that the smoothing unit (4) may generate the control signal (c) from the average value data (f). Thereafter, the variation in the difference data will exceed the predetermined value and then decrease below the predetermined value. Then, difference data at this moment is used as new average value data (f). This apparatus stabilizes the transmission output (b) from a first rise thereof.

6 Claims, 9 Drawing Sheets

APPARATUS FOR STABILIZING TRANSMISSION OUTPUT

BACKGROUND OF THE INVENTION

1. Field of the Invention

The present invention relates to an apparatus for stabilizing the level of transmission output.

The apparatus for stabilizing the level of transmission output is used, in radio communications, to reduce signal interference between channels and simplify receiver processes. The apparatus must be simple and low cost and must stabilize, in particular, a rise of an output signal when a power source is turned on or when burst communication starts.

2. Description of the Related Art

An apparatus for stabilizing transmission output according to a prior art employs integrating circuits to remove noise or the influence of modulation from a control signal that is used to feedback-control an output control unit, thereby stabilizing the level of an output signal transmitted from the output control unit.

The control signal of the prior art, however, becomes zero or nearly zero when a power source is turned on or when burst signal transmission starts. The control signal at zero or nearly zero is unable to stabilize the level of transmission output.

SUMMARY OF THE INVENTION

An object of the present invention is to stabilize a rise of a transmission output signal and subdue fluctuations in an input signal.

In order to accomplish the object, according to a first aspect of the present invention, there is provided an apparatus for stabilizing the level of an output signal by controlling an output control unit according to a control signal. The apparatus has a switching unit and a smoothing unit. The switching unit may be a switching circuit to switch initial value data and reference value data from one to another. The initial value data determines an initial value of the control signal when an input signal to the output control unit rises. The average value data is obtained from a moving average of the difference between reference value data and level data detected from the output signal of the output control unit after the input signal rises. The smoothing unit smoothes the difference between the initial value data and the average value data both provided through the switching unit, for a predetermined period and generates the control signal for the output control unit accordingly.

According to a second aspect of the present invention, the apparatus for stabilizing transmission output has a level detecting unit for detecting the level of the output signal of the output control unit and providing the level data; a difference detecting circuit for calculating a moving average of the difference between the level data and the reference value data or average value data and providing difference data; a differential value detecting circuit for detecting a variation in the difference data and providing differential data; and a switching circuit for switching the initial value data to the average value data when the differential data decreases to below a predetermined value. According to the second aspect, the smoothing unit smoothes the difference between the initial value data and the average value data both provided through the switching circuit, for the predetermined period and generates the control signal for the output control unit accordingly.

According to a third aspect of the present invention, the apparatus for stabilizing transmission output has an average value data holding circuit for holding the difference data as the average value data and a structure for providing the smoothing unit with the average value data after the differential value detecting circuit determines that a variation in the difference data has increased to above the predetermined value and then decreased to below the predetermined value.

According to a fourth aspect of the present invention, the apparatus for stabilizing transmission output has a structure for determining whether or not the average value data held in the average value data holding circuit and difference data that is provided by the difference detecting circuit after the predetermined period exceed a predetermined range, and if they exceed the predetermined range, setting the difference data as new average value data in the average value data holding circuit and providing the new average value data as current data to the smoothing unit.

According to a fifth aspect of the present invention, the smoothing unit has a multiplier for multiplying the difference between previous and current data provided through the switching circuit by function data that changes during the predetermined period; an adder for adding the product calculated by the multiplier to the previous data; and a switching unit for providing the output of the adder to generate the control signal for the output control unit for the predetermined period, and after the predetermined period, providing the current data to generate the control signal for the output control unit.

According to a sixth aspect of the present invention, the apparatus for stabilizing transmission output has a comparator for comparing the difference data from the difference detecting circuit with difference tolerance data, and if the difference data is above the difference tolerance data, controlling the switching unit to provide the initial value data to the smoothing unit.

DESCRIPTION OF THE PREFERRED EMBODIMENTS

For a better understanding of the preferred embodiments of the present invention, an apparatus for stabilizing transmission output according to a prior art will be explained with reference to FIG. 9.

Figure 9:
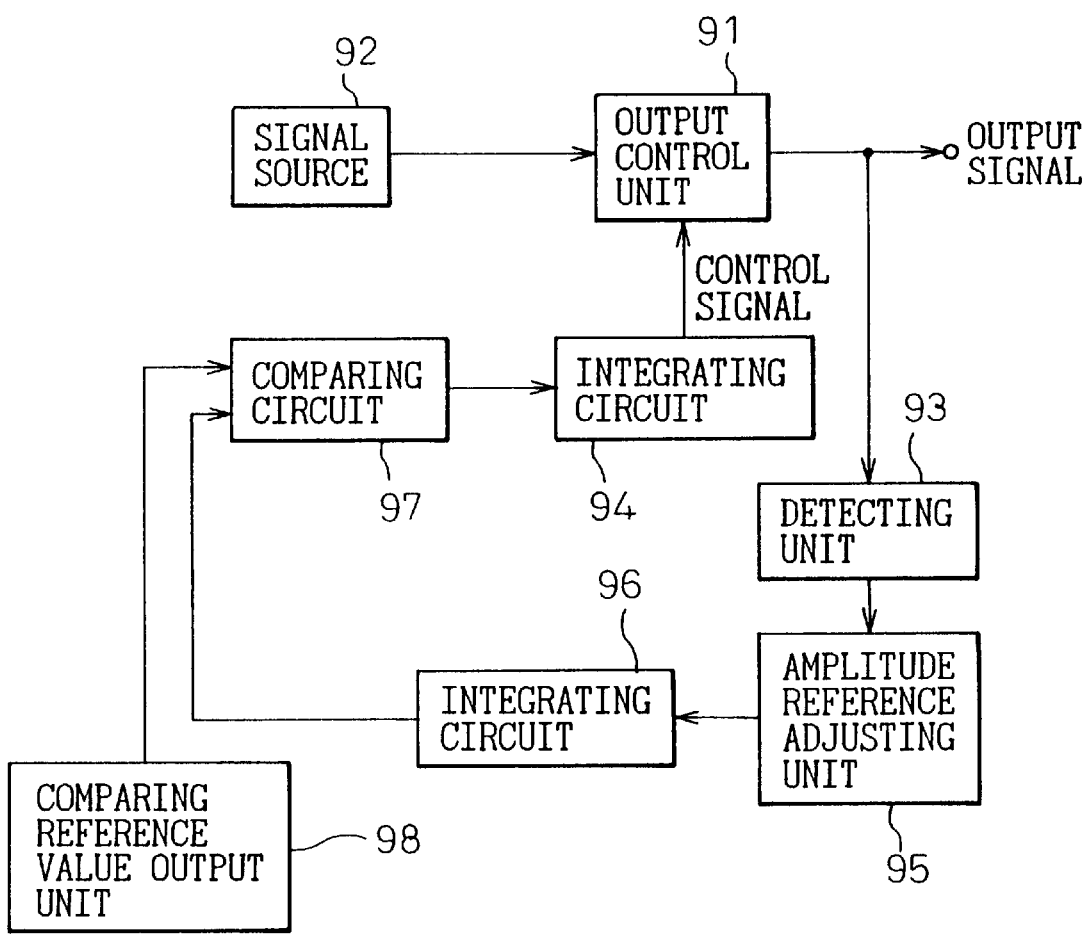
FIG. 9 shows an apparatus for stabilizing transmission output according to a prior art.

The apparatus of FIG. 9 has an output control unit 91 such as a variable attenuator or a variable gain amplifier, a signal source 92 such as a modulator or a transmission amplifier, a detecting unit 93 for receiving part of an output signal of the output control unit 91 and detecting the level thereof, integrating circuits 94 and 96, an amplitude reference adjusting unit 95, a comparing circuit 97, and a comparing reference value output unit 98.

A signal from the signal source 92 is passed through the output control unit 91 and is transmitted as an output signal from an antenna (not shown). Part of the output signal is branched by, for example, a directional coupler and is detected by the detecting unit 93. The output of the detecting unit 93 is supplied to the amplitude reference adjusting unit 95, which adjusts the output so that it may have an amplitude value suitable for comparison in the comparing circuit 97. The output of the adjusting unit 95 is supplied to the comparing circuit 97 through the integrating circuit 96.

The integrating circuit 96 serves as a loop filter having a relatively large time constant to remove envelope fluctuations due to noise or modulation from the output of the adjusting unit 95. The comparing reference value output unit 98 provides the comparing circuit 97 with a comparing reference value corresponding to a reference output signal level. The output of the comparing circuit 97 represents a difference or comparison result between the reference value and the output of the integrating circuit 96. The output of the comparing circuit 97 is supplied to the integrating circuit 94, which generates a control signal for the output control unit 91. The integrating circuit 94 serves as a loop filter having a relatively large time constant.

The integrating circuits 94 and 96 remove noise or the influence of modulation carried out on a main signal from the control signal to feedback-control the output control unit 91, thereby stabilizing the level of the output of the output control unit 91.

There is another technique that forms the above-mentioned feedback loop only for a period for transmitting a burst signal, to control the gain of a variable gain amplifier and stabilize transmission output. This technique is disclosed in, for example, Japanese Unexamined Patent Publication Nos. 6-45995 and 9-27723.

The prior art of FIG. 9 employs the integrating circuits 94 and 96 to stabilize operations. The feedback loop including the integrating circuits 94 and 96 involves a response delay that zeroes or nearly zeroes the control signal for the output control unit 91 when a power source is turned on or when burst signal transmission starts. If the control signal becomes zero or nearly zero, it will be unable to stabilize the transmission output. There is an idea to set the control signal to an initial value at the start of energizing or burst signal transmission. This idea hardly stabilizes the transmission output because the feedback loop has a response delay and because it is difficult to fix the timing of switching the initial value to a feedback value provided through the feedback loop.

There is another idea to remove the integrating circuits 94 and 96. This, however, destabilizes the transmission output because the feedback loop responds even to instantaneous envelope fluctuations in the output of the output control unit 91. Still another idea is to arrange the integrating circuits 94 and 96 and adjust the initial value to some extent. In this case, the level of transmission output during the response delay time of the feedback loop is artificially made normal.

This technique, however, enlarges an error to destabilize the transmission output unless temperature and frequency changes are precisely adjusted. In addition, this technique fixes the control signal for the output control unit 91 to an upper limit or a lower limit depending on a loop gain, to cause a large error.

The above-mentioned technique to stabilize the transmission output only for burst signal transmission has a problem to destabilize the level of a rise of an output signal when a power source is turned on or when the burst signal transmission starts.

Next, preferred embodiments of the present invention will be explained.

Figure 1:
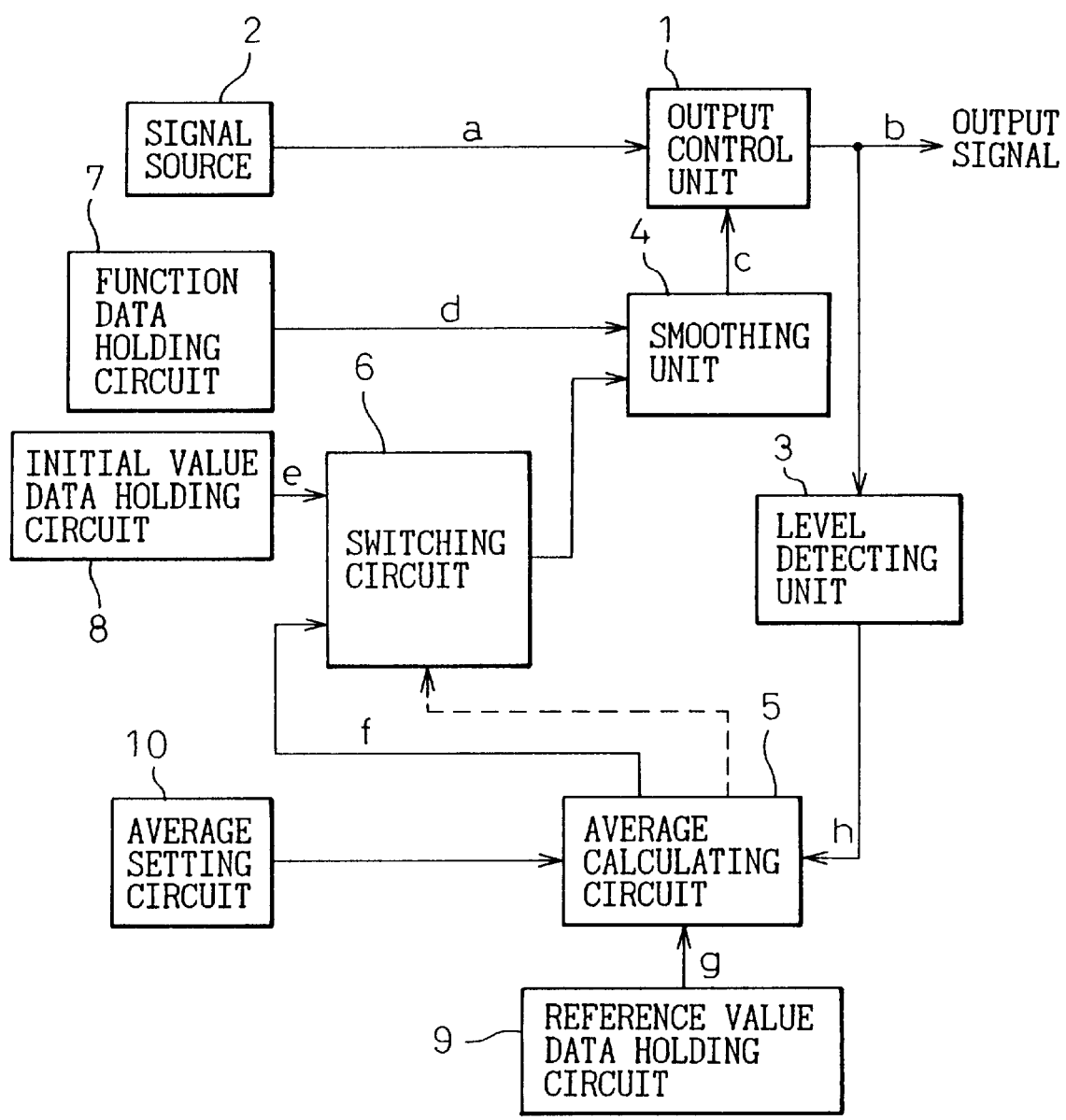
FIG. 1 shows essential parts of an apparatus for stabilizing transmission output according to a first embodiment of the present invention.

FIG. 1 shows an apparatus for stabilizing transmission output according to a first embodiment of the present invention. The apparatus has an output control unit 1, a signal source 2, a level detecting unit 3, a smoothing unit 4, an average calculating circuit 5, a switching circuit 6, a function data holding circuit 7, an initial value data holding circuit 8, a reference value data holding circuit 9, and an average setting circuit 10. The output control unit 1 may be a variable attenuator or a variable gain amplifier to control the level of an output signal "b" according to a control signal "c." The output signal "b" is transmitted outside from an antenna (not shown). The signal source 2 has a modulator or a power amplifier to provide an output signal "a" to the output control unit 1.

Part of the output signal "b" is branched by, for example, a directional coupler and is detected by the level detecting unit 3, which provides detected level data "h" to the average calculating circuit 5. The function data holding circuit 7 has a memory for holding function data "d" used for a smoothing process carried out by the smoothing unit 4. The initial value data holding circuit 8 has a memory for holding initial value data "e" used by the smoothing unit 4 when a power source is turned on or when burst signal transmission starts to raise the output signal "b." The reference value data holding circuit 9 has a memory for holding reference value data "g" used to stabilize the output signal "b."

The average calculating circuit 5 calculates a time-average of a difference or comparison result between the level data "h" and the reference value data "g." In response to an instruction from the average setting circuit 10, the average calculating circuit 5 provides average value data "f" to the switching circuit 6. The switching circuit 6 switches the initial value data "e" and the average value data "f" from one to another and provides the selected one to the smoothing unit 4.

When the signal source 2 starts to provide the signal "a" to the output control unit 1 when the power source is turned on or when burst signal transmission starts, the switching circuit 6 provides the initial value data "e" to the smoothing unit 4. The smoothing unit 4 generates the control signal "c" of a fixed value according to the initial value data e, and the control signal "c" controls the output control unit 1. The output control unit 1 provides the output signal "b," and the level detecting unit 3 detects the level of the output signal "b" and provides the level data "h." The average calculating circuit 5 calculates a phase-averaged difference between the level data "h" and the reference value data "g" and provides the average value data "f" to the switching circuit 6.

The signal "a" provided by the signal source 2 when the power source is turned on or when burst signal transmission starts is controlled to a level by the output control unit 1, which provides the output signal "b" accordingly. While the signal "a" is rising, the average value data "f" from the average calculating circuit 5 continuously changes. When the signal "a" has nearly completely risen, the level data "h" from the level detecting unit 3 is approximately the reference value data "g." Then, a change in the average value data "f" is substantially stabilized. When a change in the average value data "f" comes within a predetermined range, the switching circuit 6 is controlled to provide the average value data "f" to the smoothing unit 4.

The smoothing unit 4 smoothes the difference between the previous initial value data "e" and the current average value data "f" for a predetermined period and generates the control signal "c" accordingly. The control signal "c" is supplied to the output control unit 1. Once the signal "a" has completely risen, the difference between the level data "h" and the reference value data "g" serves as an error, and the smoothing unit 4 generates the control signal "c" to cancel the error, thereby stabilizing the level of the output signal "b."

Figure 2:
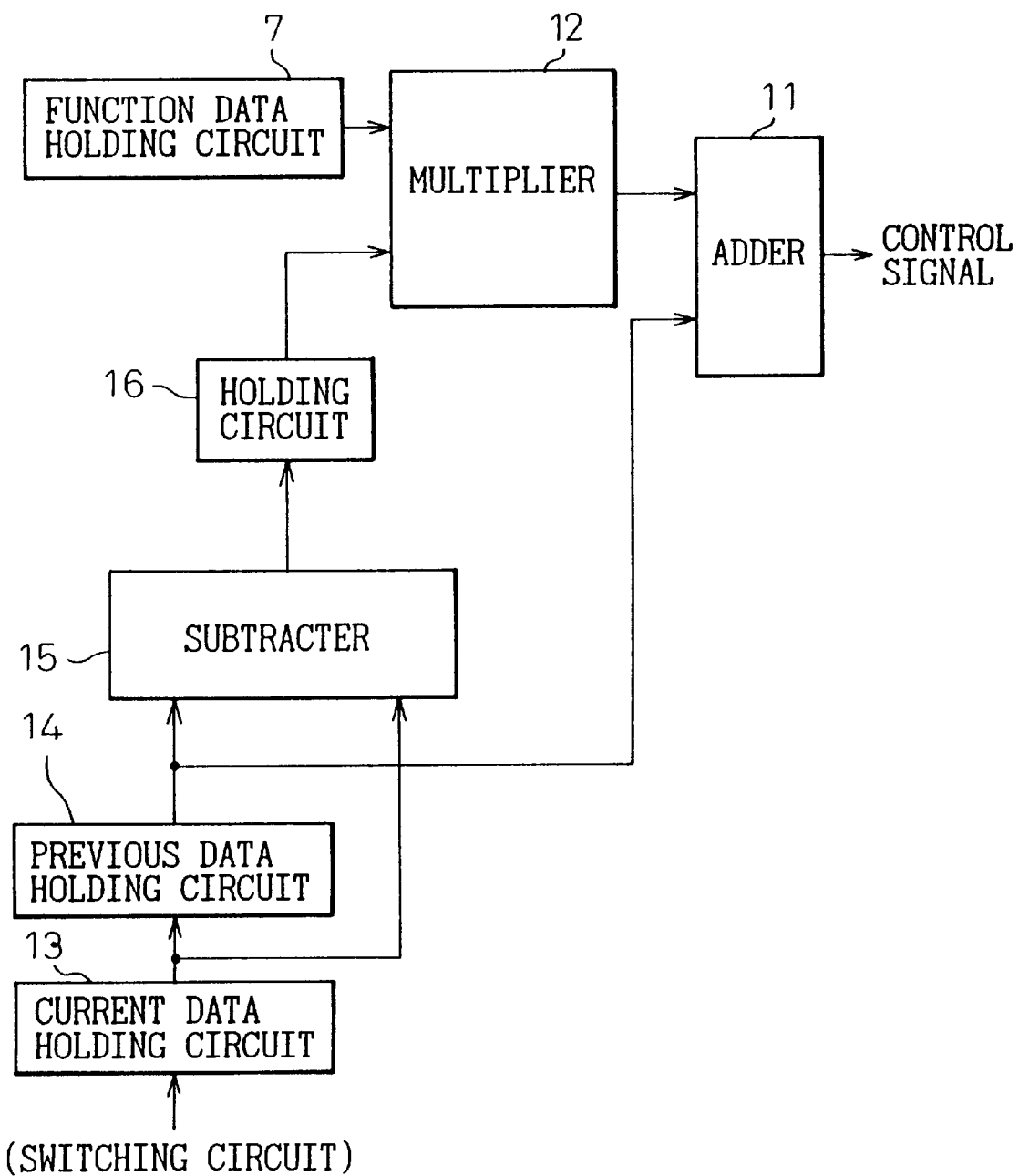
FIG. 2 shows a smoothing unit of the apparatus of the present invention.

FIG. 2 shows the details of the smoothing unit 4. The smoothing unit 4 has an adder 11, a multiplier 12, a current data holding circuit 13, a previous data holding circuit 14, a subtracter 15, and a holding circuit 16 for holding the output of the subtracter 15. The function data holding circuit 7 is connected to the multiplier 12. The switching circuit 6 (FIG. 1) provides one of the initial value data "e" and average value data "f" to the current data holding circuit 13, which temporarily holds the same as current data. The subtracter 15 calculates the difference between the current data and previous data in the previous data holding circuit 14, and the difference is held by the holding circuit 16. The multiplier 12 receives function data "d" from the function data holding circuit 7 and the difference data from the holding circuit 16.

The function data holding circuit 7 successively provides function data to the multiplier 12 in response to a clock signal (not shown) so that the function data is used for a smoothing process. The multiplier 12 carries out, for example, a signed operation to multiply signed difference data provided by the subtracter 15 by the function data "d" and provides the product to the adder 11. The adder 11 adds the product to the previous data and generates the control signal "c." After the completion of the smoothing process for a predetermined period, a switch (not shown) of the smoothing unit 4 switches the output of the adder 11 to the current data held in the current data holding circuit 13, so that the current data may be used to generate the control signal "c" for the output control unit 1.

In the smoothing process, the output of the subtracter 15 is positively-signed data if the previous data is smaller than the current data, and negatively-signed data if the previous data is greater than the current data. If the previous data is smaller than the current data, the output of the multiplier 12 is added to the previous data so that the previous data may smoothly change to the current data. If the previous data is greater than the current data, the output of the multiplier 12 is subtracted from the previous data so that the previous data may smoothly change to the current data.

Figure 3:
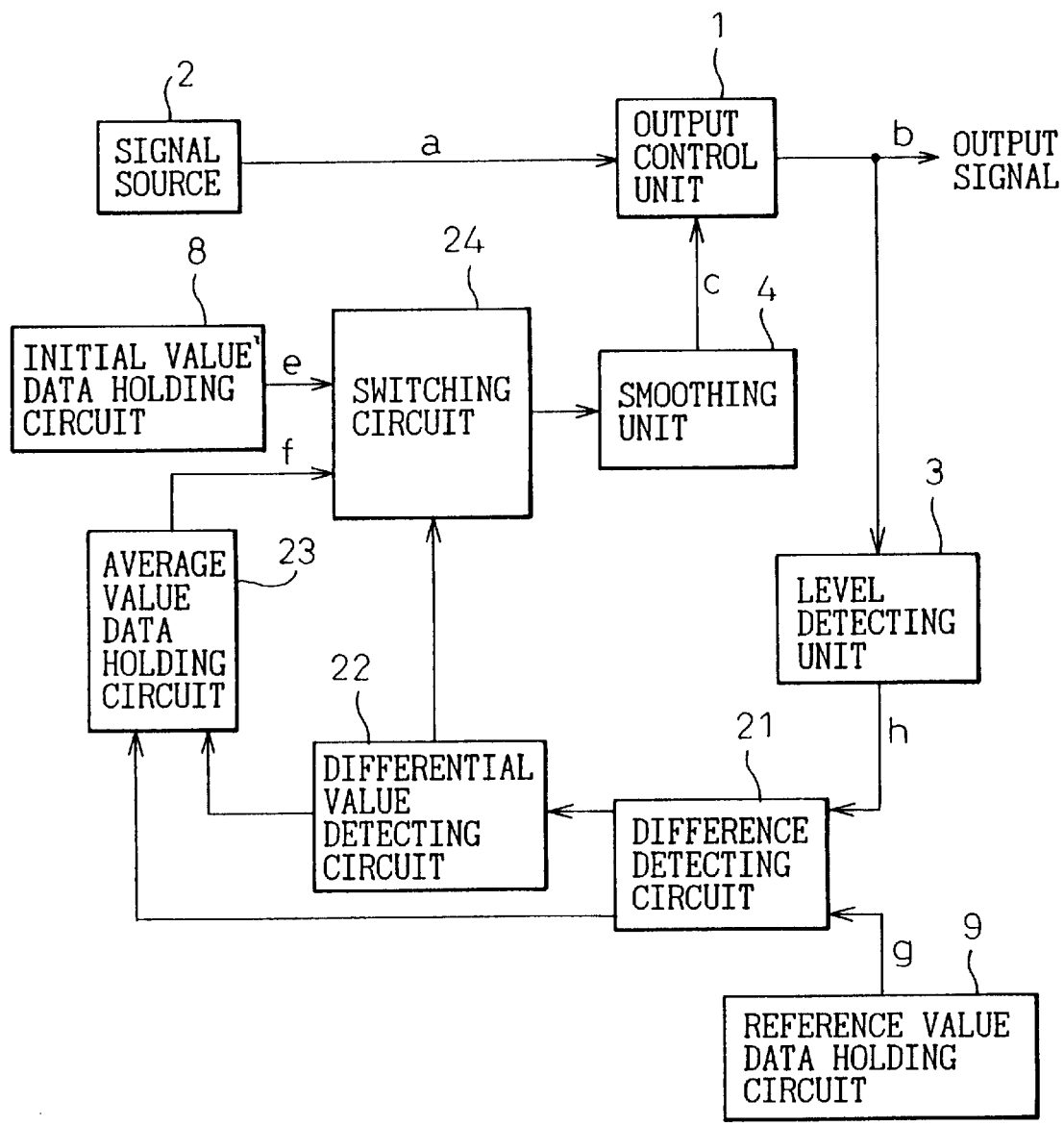
FIG. 3 shows essential parts of an apparatus for stabilizing transmission output according to a second embodiment of the present invention.

FIG. 3 shows an apparatus for stabilizing transmission output according to a second embodiment of the present invention. The same parts as those of the first embodiment of FIG. 1 are indicated with like reference marks. The second embodiment has a differential value detecting circuit 22, an average value data holding circuit 23, and a switching circuit 24. The switching circuit 24 corresponds to the switching circuit 6 of FIG. 1. The switching circuit 24 is controlled by the differential value detecting circuit 22. A difference detecting circuit 21, the differential value detecting circuit 22, and the average value data holding circuit 23 provide the function achieved by the average calculating circuit 5 of FIG. 1. A function data holding circuit for providing function data to a smoothing unit 4 is not shown in FIG. 3.

When a power source is turned on or when burst signal transmission starts, the switching circuit 24 provides the smoothing unit 4 with initial value data "e" from an initial value data holding circuit 8. A level detecting unit 3 detects the level of an output signal "b" of an output control unit 1 and provides the difference detecting circuit 21 with detected level data "h." The circuit 21 calculates a moving average of the difference between the level data "h" and reference value data "g" from a reference value data holding circuit 9 and provides difference data to the differential value detecting circuit 22 and average value data holding circuit 23.

The differential value detecting circuit 22 detects a variation in the difference data. For example, the circuit 22 may find differential data from a time-average of the difference between previous and current difference data and determine whether or not the differential data is above a predetermined value. If the variation is below the predetermined value, the circuit 22 determines that an output signal "a" from a signal source 2 has substantially risen after the energizing of the power source or the start of burst signal transmission. Then, the circuit 22 switches the switching circuit 24 from the initial value data holding circuit 8 to the average value data holding circuit 23.

In response to the output of the differential value detecting circuit 22 indicating that a variation in the difference data is small, the average value data holding circuit 23 holds the difference data from the difference data detecting circuit 21 as average value data "f." The switching circuit 24 provides the average value data "f" to the smoothing unit 4, which generates the control signal "c" accordingly for the output control unit 1.

If the level of the output signal "b" varies, the detected level data "h", as well as the difference data from the difference detecting circuit 21, vary. The variation in the difference data will exceed the predetermined value and then decrease below the predetermined value once the level of the output signal "b" is stabilized. In this case, the differential value detecting circuit 22 controls the average value data holding circuit 23 to hold the difference data from the difference detecting circuit 21 as new average value data "f," which is supplied to the smoothing unit 4 through the switching circuit 24. The smoothing unit 4 carries out the smoothing process for the predetermined period. Consequently, the level of the output signal "b" is stabilized from the beginning of a rise thereof even if there are temperature changes, etc.

Figure 4:
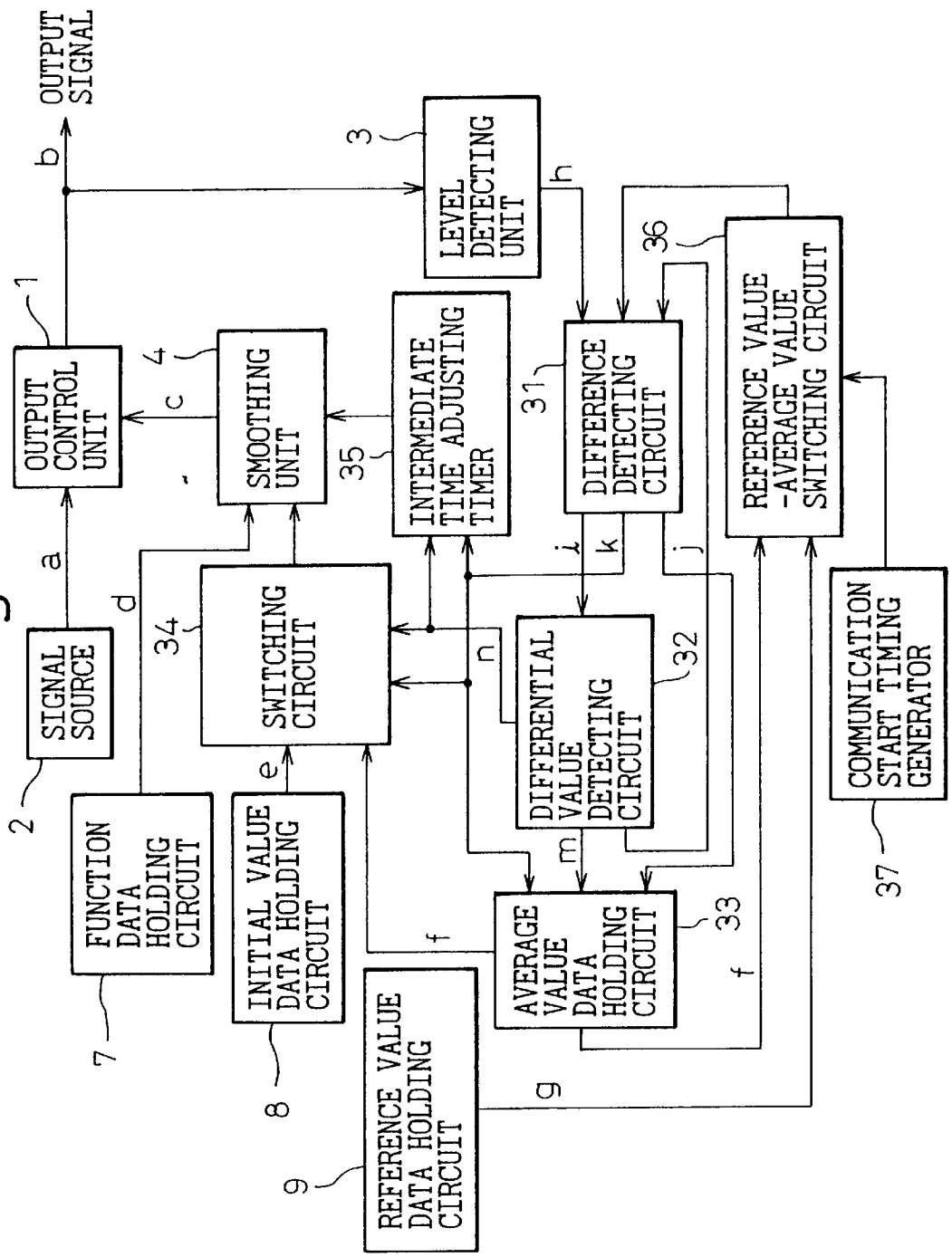
FIG. 4 shows essential parts of an apparatus for stabilizing transmission output according to a third embodiment of the present invention.

FIG. 4 shows an apparatus for stabilizing transmission output according to a third embodiment of the present invention. The same parts as those of the first embodiment of FIG. 1 are represented with like reference marks. The third embodiment has a difference detecting circuit 31, a differential value detecting circuit 32, an average value data holding circuit 33, a switching circuit 34, an intermediate time adjusting timer 35, a reference value-average value switching circuit 36, and a communication start timing generator 37.

When a power source is turned on or when burst signal transmission starts, the timing generator 37 controls the switching circuit 36 to supply reference value data "g" from a reference value data holding circuit 9 to the difference detecting circuit 31, and after a predetermined period, average value data "f" from the average value data holding circuit 33 to the circuit 31.

The difference detecting circuit 31 calculates a moving average of the difference between level data "h" detected by a level detecting unit 3 and the reference value data "g" or the average value data "f" and provides difference data "i" and "j" to the differential value detecting circuit 32 and average data holding circuit 33, respectively. If the difference data "i" and "j" are above a predetermined value, the circuit 31 provides a signal "k" to the switching circuit 34 and timer 35.

Similar to the differential value detecting circuit 22 of FIG. 3, the differential value detecting circuit 32 detects a variation in the difference data "i." If the variation fulls below a predetermined value, the circuit 32 provides signals "m" and "n" to the average value data holding circuit 33 and switching circuit 34, respectively. Upon receiving the signal n, the switching circuit 34 switches initial value data "e" from an initial value data holding circuit 8 to the average value data "f" from the circuit 33 and supplies the selected one to a smoothing unit 4. In response to the signal "k" from the difference detecting circuit 31 to indicate that the difference data "i" and "j" are above the predetermined value, the switching circuit 34 provides the smoothing unit 4 with the initial value data "e."

If the level of an output signal "b" of the output control unit 1 greatly exceeds the reference value "g," a variation in the difference data "i" increases. In this case, the control signal "c" is generated from the initial value data "e" to start stabilizing the output signal "b." When a variation in the difference data "i" decreases below the predetermined value, the output signal "b" is around the reference value "g." Then, the control signal "c" is generated from the average value data "f" from the circuit 33, to control the output control unit 1.

The timer 35 counts a preset intermediate time. During the intermediate time, the smoothing unit 4 smoothes the difference between previous and current data, which are the initial value data "e" and average value data "f" provided through the switching circuit 34, according to function data "d" provided by a function data holding circuit 7, thereby generating the control signal "c" for the output control unit 1. After the intermediate time, the smoothing unit 4 uses the average value data "f" in the circuit 33, to generate the control signal "c."

Figure 5:
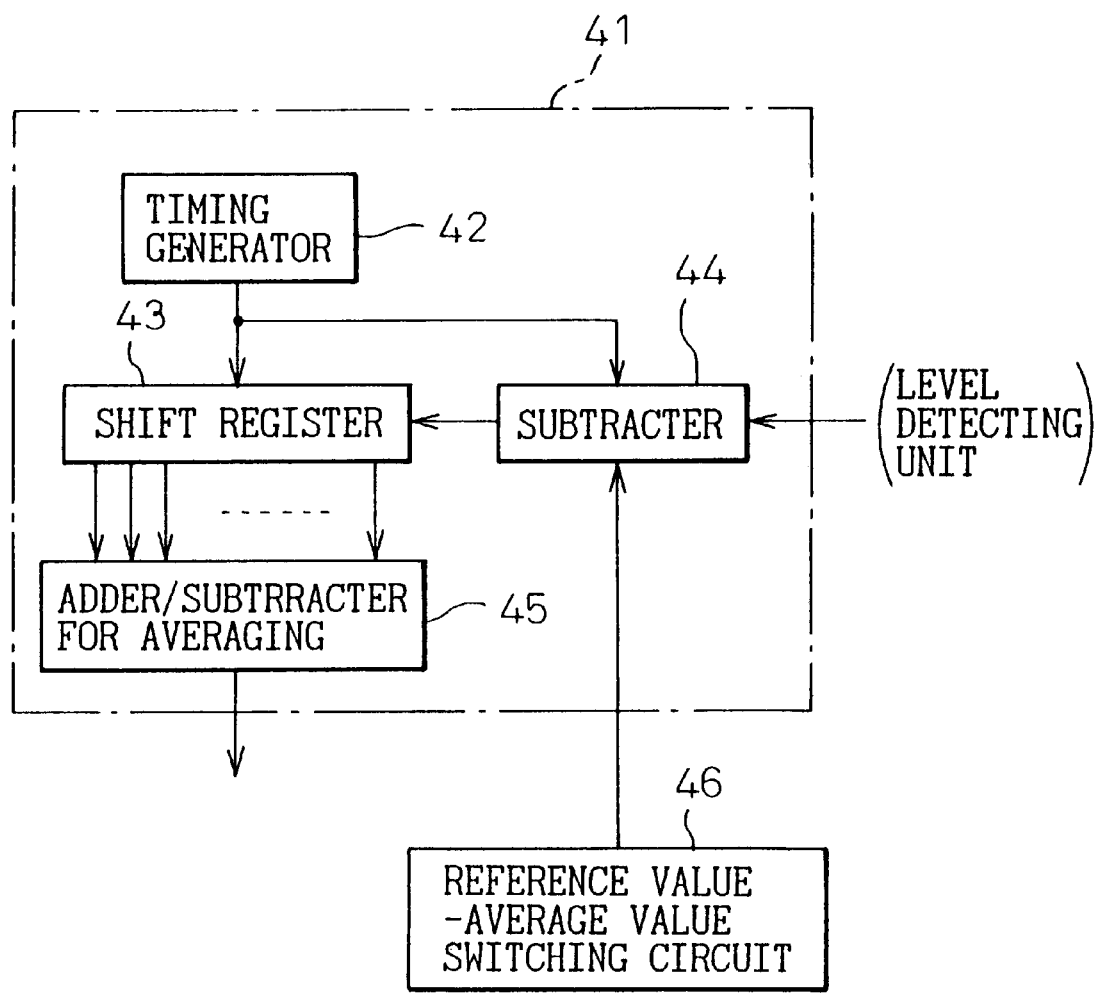
FIG. 5 shows a difference detecting circuit of the apparatus of the present invention.

FIG. 5 shows a difference detecting circuit 41. This circuit corresponds to the difference detecting circuit 21 of FIG. 3 or the difference detecting circuit 31 of FIG. 4. The difference detecting circuit 41 has a timing generator 42, a shift register 43, a subtracter 44, an adder/subtracter 45 for averaging, and a reference value-average value switching circuit 46 that corresponds to the switching circuit 36 of FIG. 4.

In the arrangement of FIG. 3, the output of the adder/subtracter 45 is supplied to the differential value detecting circuit 22 and average value data holding circuit 23, and in FIG. 4, to the differential value detecting circuit 32 and average value data holding circuit 33. In FIG. 4, the signal "k" is supplied to the switching circuit 34, timer 35, and average value data holding circuit 33 when the difference detected by the circuit 31 is large. The signal "k" may be generated by an arrangement (not shown in FIG. 5) that compares the output of the adder/subtracter 45 with a set value, and if the output is above the set value, generates the signal k.

The timing generator 42 generates a shift clock signal for the shift register 43 and a timing signal for the subtracter 44 to carry out a subtraction process. The subtracter 44 subtracts the reference or average value data provided through the switching circuit 46 from the level data provided by the level detecting unit 3 (FIGS. 1, 3, and 4) and supplies the difference to the shift register 43. The adder/subtracter 45 sums up the output of every stage of the shift register 43 and finds an average of the sum. This is to calculate a moving average of an accumulation of the output of the subtracter 44. Even if a momentary large variation occurs due to noise, this arrangement is capable of properly providing an averaged difference.

Figure 6:
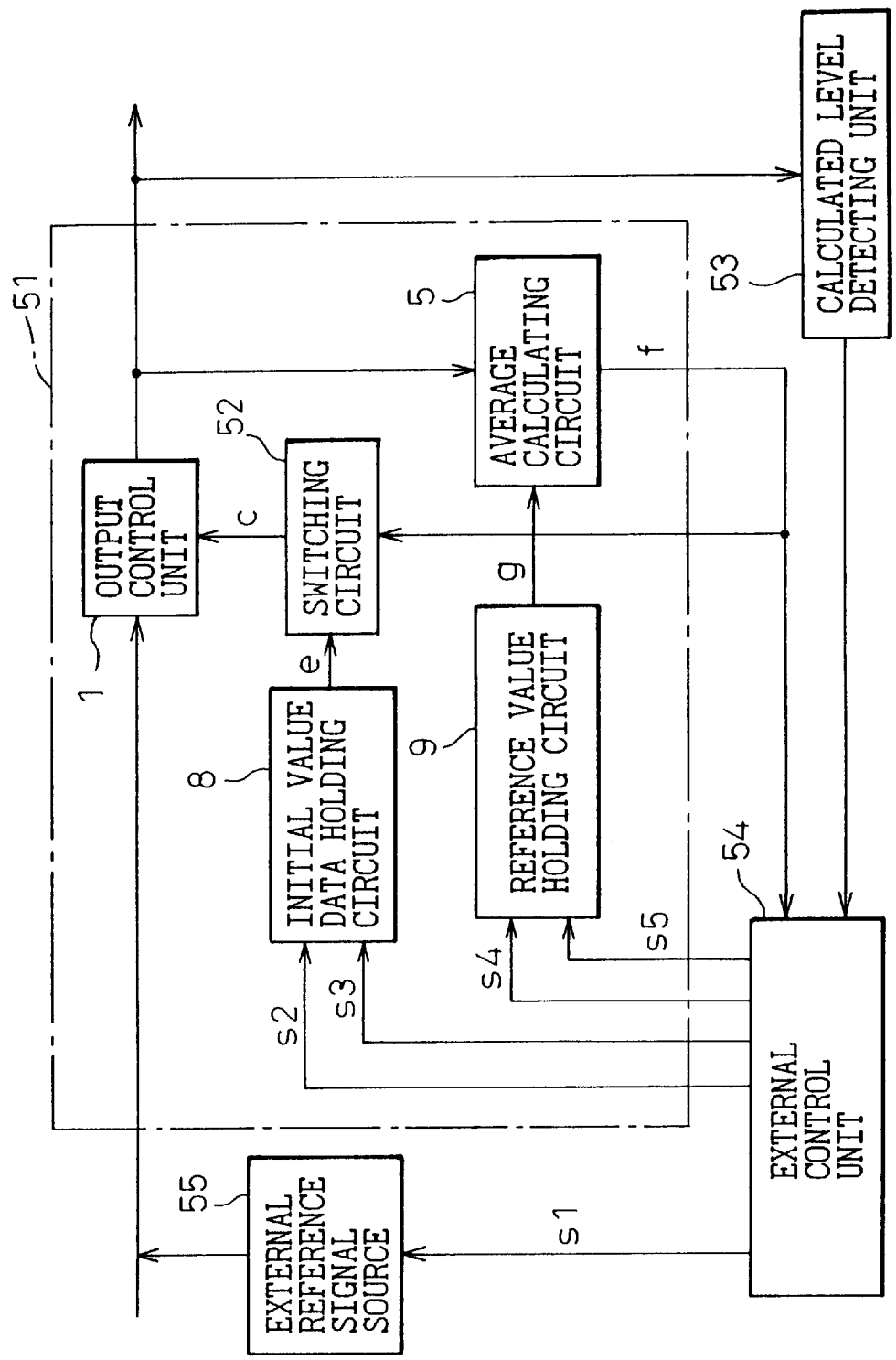
FIG. 6 shows essential parts for carrying out an initial setting process of the apparatus of the present invention.

FIG. 6 explains an initial setting process carried out by the apparatus of the present invention. An apparatus 51 corresponds to the apparatus for stabilizing transmission output of any one of FIGS. 1, 3, and 4. The apparatus 51 has an output control unit 1, an average calculating circuit 5, an initial value data holding circuit 8, a reference value data holding circuit 9, a switching circuit 52, a reference level detecting unit 53, an external control unit 54, and an external reference signal source 55. FIG. 6 shows only essential parts of the apparatus 51.

The external control unit 54 operates during a training period that sets initial value data and reference value data. The external control unit 54 provides a signal s1 for controlling the external reference signal source 55, data s3 for the initial value data holding circuit 8, data s5 for the reference value data holding circuit 9, and instruction signals s2 and s4. When the initial setting process for the apparatus 51 is started, the circuit 8 receives the instruction and data s2 and s3 to set optional initial value data. At the same time, the circuit 9 receives the instruction and data s4 and s5 to set optional reference value data.

The external reference signal source 55 is structured to provide a signal like the signal provided by the signal source 2 of FIGS. 1, 3, and 4. The switching circuit 52 corresponds to the switching circuit 6 of FIG. 1, the switching circuit 24 of FIG. 3, or the switching circuit 34 of FIG. 4. The average calculating circuit 5 calculates an average of the difference between level data detected from an output signal of the output control unit 1 and reference value data "g" from the reference value data holding circuit 9. The average calculating circuit 5 provides average value data "f" to the external control unit 54 and switching circuit 52. The reference level detecting unit 53 determines whether or not the level of the output signal of the output control unit 1 is equal to a reference level and provides a resultant signal to the external control unit 54.

First, the switching circuit 52 generates a control signal "c" for the output control unit 1 from temporary initial value data "e" provided by the initial value data holding circuit 8. To make the control signal "c" bring the level of the output signal of the output control unit 1 close to the reference level, the external control unit 54 provides the instruction and data s2 and s3 to the circuit 8. Consequently, the data s3 that makes the level of the output signal of the output control unit 1 equal to the reference level is set as the initial value data "e."

Thereafter, the switching circuit 52 switches the initial value data "e" to the average value data "f" and generates the control signal "c" for the output control unit 1 accordingly. The reference level detecting unit 53 determines whether or not the level of the output signal of the output control unit 1 is equal to the reference level and provides a resultant signal to the external control unit 54. The unit 54 provides the instruction and data s4 and s5 to the reference value data holding circuit 9, so that the switching circuit 52 may supply the average value data "f" as the control signal "c" to the output control unit 1. Consequently, the data s5 that makes the level of the output signal of the output control unit 1 equal to the reference level is set as the reference value data "g."

Figure 7:
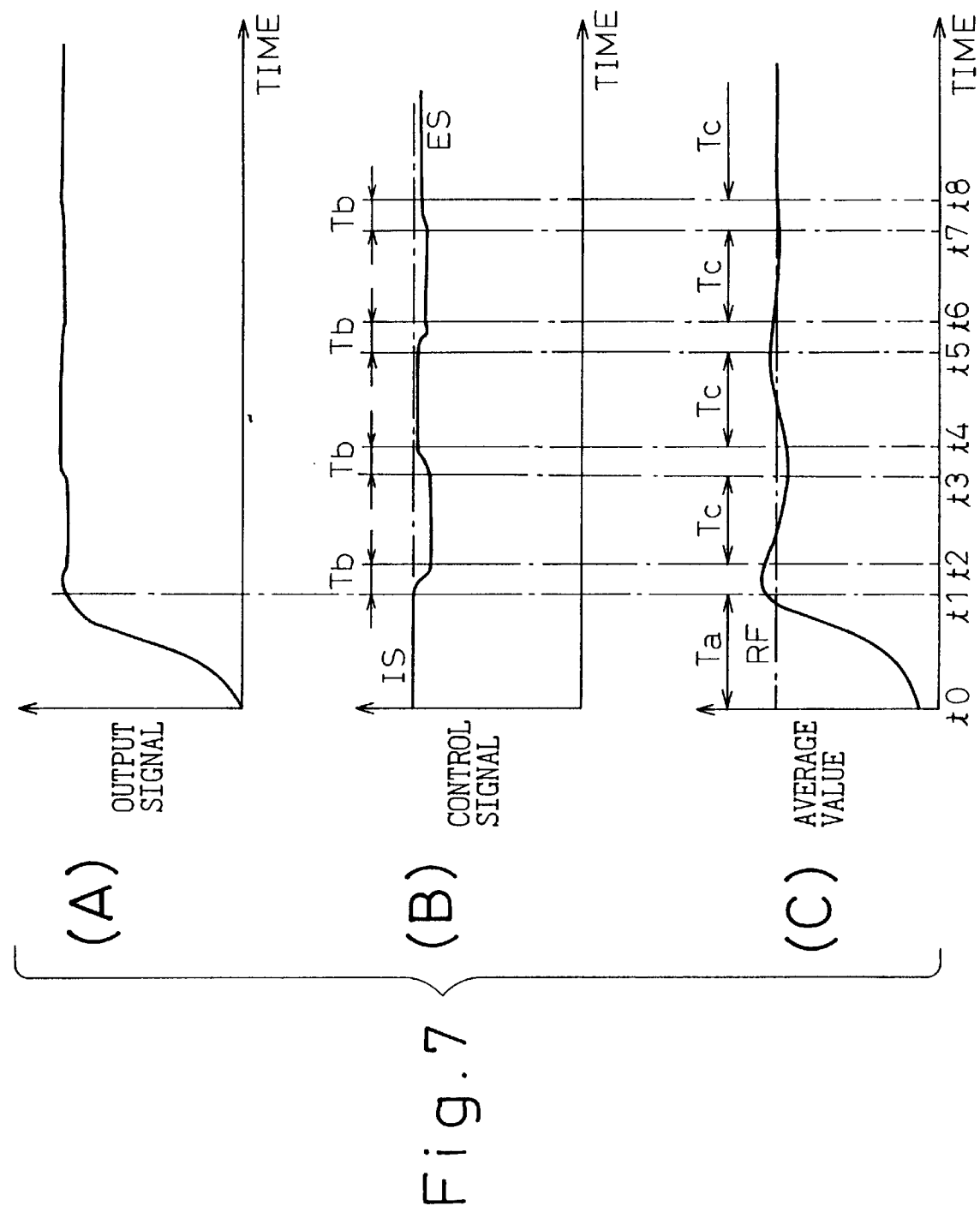
FIG. 7 shows the operation of the apparatus of the present invention.

FIG. 7 roughly explains the operation of the apparatus of the present invention, in which FIG. 7(A) shows the output signal "b," FIG. 7(B) the control signal "c," and FIG. 7(C) an average of detected level of the output signal "b." A reference mark IS is an initial value based on the initial value data "e," ES a convergence value of the control signal "c," RF a reference value based on the reference value data "g," Ta a time for providing the initial value, Tc an average calculating time, and Tb an intermediate time. For example, the time Ta is between t0 and t1, the time Tb between t1 and t2, and t3 and t4, and the like, and the time Tc between t2 and t3, t4 and t5, and the like. The intermediate time Tb is set by, for example, the intermediate time adjusting timer 35 of FIG. 4. The operation of the apparatus of the present invention will be explained with reference to FIG. 7 based on the arrangement of FIG. 4.

At t0, the power source is turned on or burst signal transmission starts. The output signal "b" of the output control unit 1 rises as shown in FIG. 7(A). An average of level data detected by the level detecting unit 3 rises as shown in FIG. 7(C) in response to a rise of the output signal "b." Initial value data "e" is set in the initial value data holding circuit 8 according to the training process mentioned above. The switching circuit 34 selects the initial value data "e" for the smoothing unit 4, which generates the control signal "c" having the constant initial value IS for the output control unit 1 during the initial value providing time Ta.

The reference value data holding circuit 9 provides the reference value data "g" to the reference value-average value switching circuit 36, which provides the same to the difference detecting circuit 31. The circuit 31 calculates the difference between the reference value data "g" and the level data "h" from the level detecting unit 3 and provides difference data "i" and "j" according to a moving average of the calculated difference. The difference data "i" is supplied to the differential value detecting circuit 32, and the difference data "j" to the average value data holding circuit 33.

The differential value detecting circuit 32 detects a variation in the difference data "i." This variation corresponds to the inclination of the curve of FIG. 7(C) and decreases below a predetermined value at t1. Then, the circuit 32 provides a signal "m" to make the average value data holding circuit 33 hold, as average value data "f," the difference data "j" from the difference detecting circuit 31. At the same time, the circuit 32 provides a signal "n" to make the switching circuit 34 switch the initial value data "e" to the average value data "f." The signal "n" activates the timer 35 to start the smoothing process by the smoothing unit 4.

If the average value data "f" in the circuit 33 is lower than the initial value data "e," the smoothing unit 4 smoothly reduces the difference between the initial value data "e" and the average value data "f" during the intermediate time Tb between t1 and t2 according to the function data "d" and generates the control signal "c" as shown in FIG. 7(B). The control signal "c" controls the output control unit 1 to stabilize the level of the output signal "b." In response to a signal from the communication start timing generator 37, the switching circuit 36 selects the average value data "f" from the circuit 33 and provides the selected one to the difference detecting circuit 31.

The timer 35 completely counts the intermediate time Tb at t2. Thereafter, the control signal "c" is generated according to the average value data "f" provided by the average value data holding circuit 33. As a result, the control signal "c" is constant during the average calculating time Tc as shown in FIG. 7(B).

During the average calculating time Tc, the differential value detecting circuit 32 detects a variation in the difference between the detected level data "h" and the average value data "f." If the variation exceeds the predetermined value and then decreases below the predetermined value in the average calculating time Tc between t2 and t3, i.e., if the level of the output signal "b" becomes substantially stable, the difference data obtained from a moving average between t2 and t3 is set in the average value data holding circuit 33. At the same time, the timer 35 is activated. According to the newly set average value data, the smoothing unit 4 smoothes the intermediate time Tb between t3 and t4. As a result, the control signal "c" between t3 and t4 changes as shown in FIG. 7(B). In the following average calculating time Tc between t4 and t5, the control signal "c" becomes constant according to the average value data in the circuit 33.

A variation in the difference data detected by the differential value detecting circuit 32 increases above the predetermined value and then decreases below the same. Then, new average value data is used to control the control signal "c." These operations are repeated to quickly settle the control signal "c" to the convergence value ES.

As shown in FIG. 3, it is possible to continuously supply only the reference value data "g" to the difference detecting circuit 21. In FIG. 7, it is possible to estimate the initial value providing time Ta because it is possible to estimate the points t0 and t1. Then, the period Ta may be determined by a timer.

Figure 8:
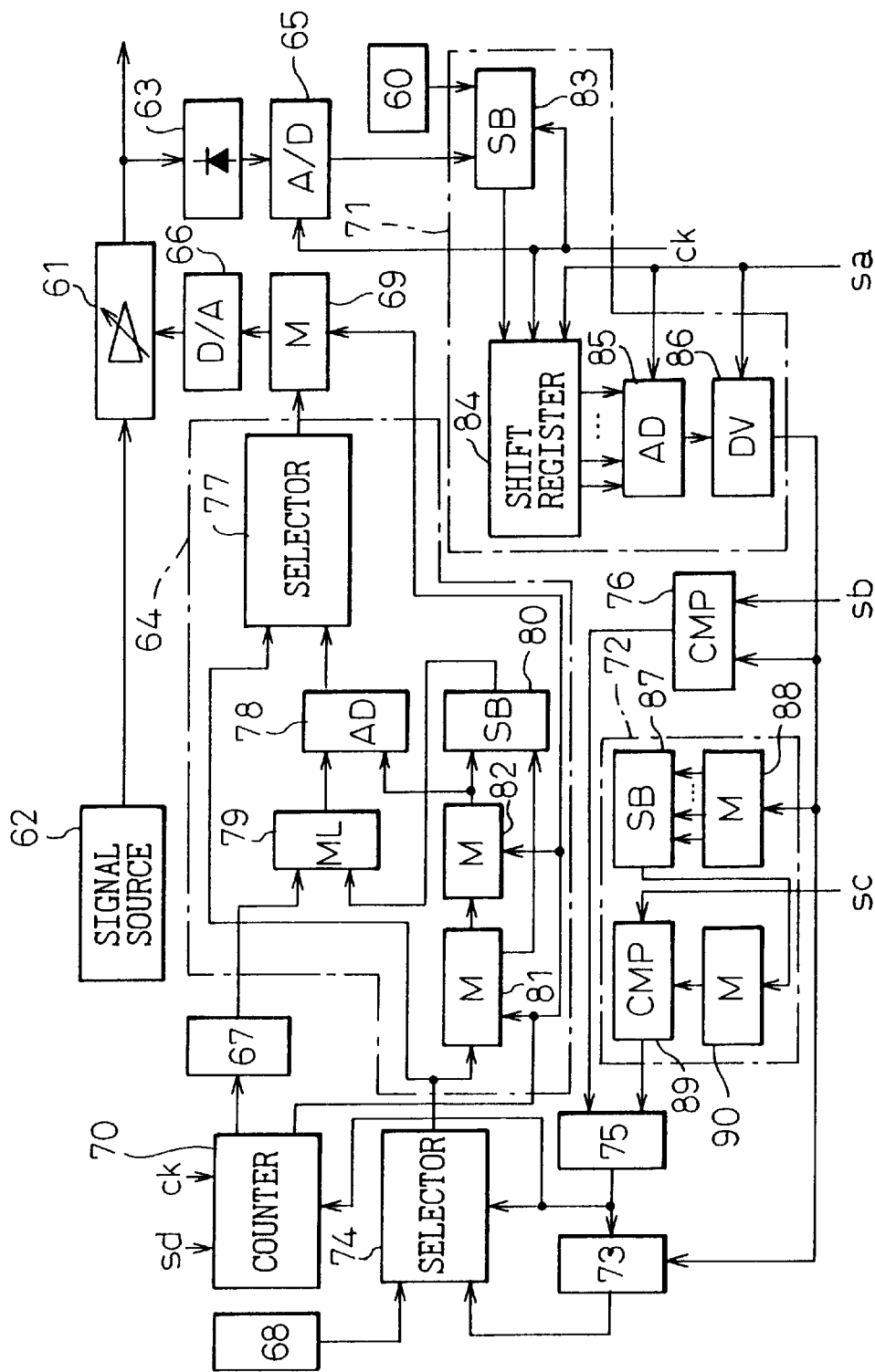
FIG. 8 shows the details of the apparatus of the present invention.

FIG. 8 shows the details of an apparatus for stabilizing transmission output according to the present invention. The apparatus has a reference value data holding circuit 60, an output control unit 61, a signal source 62, a wave detector 63, a smoothing unit 64, an A/D converter 65, a D/A converter 66, a function data holding circuit 67, an initial value data holding circuit 68, a data holding circuit (M) 69, a counter 70, a difference detecting circuit 71, a differential value detecting circuit 72, an average value data holding circuit 73, a selector 74, an OR circuit (or any other gate circuit) 75, a comparator (CMP) 76, a selector 77, an adder (AD) 78, a multiplier (ML) 79, a subtracter (SB) 80, a current data holding circuit (M) 81, a previous data holding circuit (M) 82, a subtracter (SB) 83, a shift register 84, an adder (AD) 85, a divider (DV) 86, a subtracter (SB) 87, data holding circuits (M) 88 and 90, and a comparator (CMP) 89.

The output control unit 61 and signal source 62 correspond to the output control unit 1 and signal source 2 of any one of the embodiments mentioned above. The D/A converter 66 provides an analog control signal to control the output control unit 61. The smoothing unit 64 corresponds to the smoothing unit 4 of any one of the above-mentioned embodiments. The selector 77 serves as a switch to select the output of the adder 78 during the intermediate time Tb, or average value data provided through the selector 74 during the average calculating time Tc that follows the intermediate time Tb.

The function data holding circuit 67 corresponds to the function data holding circuit 7, the initial value data holding circuit 68 corresponds to the initial value data holding circuit 8, and the reference value data holding circuit 60 corresponds to the reference value data holding circuit 9. The wave detector 63 and A/D converter 65 provide the function of the level detecting unit 3 for detecting the level of an output signal of the output control unit 61. The selector 74 corresponds to any one of the switching circuits 6, 24, and 34.

A reference clock signal ck is supplied to the respective parts. The counter 70 corresponds to the intermediate time adjusting timer 35. The counter 70 counts the reference clock signal ck for a period specified by a value sd, which may correspond to the intermediate time Tb. The counter 70 provides the function data holding circuit 67 with a signal to sequentially provide function data. Also, the counter 70 provides the current data holding circuit 81, previous data holding circuit 82, and data holding circuit 69 with a signal to set data.

The smoothing unit 64 includes the adder 78, multiplier 79, subtracter 80, current data holding circuit 81, and previous data holding circuit 82. These parts correspond to the adder 11, multiplier 12, subtracter 15, present data holding circuit 13, and previous data holding circuit 14 of FIG. 2, respectively. In the period (intermediate time Tb) corresponding to the value sd set in the counter 70, the smoothing unit 64 sequentially reads function data from the function data holding circuit 67. The multiplier 79 multiplies a difference provided by the subtracter 80 between the current and previous data by the function data. The adder 78 adds the product calculated by the multiplier 79 to the previous data, to smooth the difference between the current and previous data. The output of the adder 78 is supplied to the data holding circuit 69 through the selector 77.

The data in the data holding circuit 69 is converted by the D/A converter 66 into an analog signal, which is supplied as a control signal to the output control unit 61. After the completion of the period (intermediate time Tb) corresponding to the value sd set in the counter 70, the selector 77 selects the output (average value data) of the selector 74 and sends the selection to the data holding circuit 69. If the output control unit 61 is structured to be controlled by a digital signal, the D/A converter 66 may be omitted.

The difference detecting circuit 71 includes the subtracter 83, shift register 84, adder 85, and subtracter 86 and corresponds to the difference detecting circuit 41 of FIG. 5. The function of the adder/subtracter 45 of FIG. 5 is realized by the adder 85 and divider 86. The output data of a certain number of output stages of the shift register 84 specified by a set average value sa are summed up by the adder 85. The divider 86 divides the sum by the certain number to provide a moving average to form difference data. The difference data is supplied to the comparator 76, average value data holding circuit 73, and data holding circuit 88.

The differential value detecting circuit 72 includes the data holding circuits 88 and 90, subtracter 87, and comparator 89. The circuit 72 corresponds to the differential value detecting circuit 22 of FIG. 3 or the differential value detecting circuit 32 of FIG. 4. The data holding circuit 88 works like a shift register to sequentially hold several pieces of difference data provided by the difference detecting circuit 71 and provides the accumulated data to the subtracter 87. The subtracter 87 calculates the difference between previous and current difference data and provides the difference to the data holding circuit 90. This difference corresponds to a differential value, which is temporarily held in the data holding circuit 90.

The comparator 89 compares the differential data held in the data holding circuit 90 with a tolerance value sc. If the differential data is below the tolerance value sc, it is determined that a variation in the output signal of the output control unit 61 is converging. The comparator 89 sends a resultant signal to the OR circuit 75, whose output is supplied to the average value data holding circuit 73, selector 74, and counter 70. The output of the comparator 89 corresponds to, for example, the signals "m" and "n" of the differential value detecting circuit 32 of FIG. 4.

In response to the signal from the differential value detecting circuit 72, the average value data holding circuit 73 holds, as average value data, the difference data from the difference detecting circuit 71 at the moment. In response to the signal from the circuit 72, the selector 74 switches itself from the initial value data holding circuit 68 to the average value data holding circuit 73. At the same time, the counter 70 starts to count the reference clock signal ck. The smoothing unit 64 starts the smoothing process, and the selector 77 is switched to the adder 78.

The comparator 76 compares the difference data from the difference detecting circuit 71 with a tolerance value sb. If the difference data is above the tolerance value sb, a variation in the output signal of the output control unit 61 is large. Then, the comparator 76 provides a comparison result to the OR circuit 75, whose output is supplied to the average value data holding circuit 73, selector 74, and counter 70. This comparison resultant signal corresponds to the signal "k" of the difference detecting circuit 31 of FIG. 4. The selector 74 selects the initial value data holding circuit 68, and the smoothing unit 64 starts the smoothing process to provide the output control unit 61 with a control signal based on the initial value data. This output level control is the same as that carried out when the output signal of the output control unit 61 rises.

The parts mentioned above may be realized with discrete parts, or the function of these parts may be realized with the functions of, for example, a digital signal processor (DSP). The present invention is applicable to transmit burst signals in a time divisional manner with the levels of signals to be transmitted in individual time slots being controlled differently. In this case, the initial value data holding circuit 68 holds several pieces of initial value data corresponding to the time slots, and the reference value data holding circuit 60 holds several pieces of reference value data corresponding to the time slots. These pieces of data are read for the respective time slots, to carry out the above-mentioned output level control.

In FIG. 7, the initial value providing time Ta and average calculating time Tc may be fixed according to a timer or a counter, like the intermediate time Tb. If a variation in difference data is below a predetermined value at the end of the average calculating time Tc, the intermediate time Tb may be omitted.

As explained above, the present invention generates the control signal "c" according to the initial value data "e" during a rise of the signal "a" when a power source is turned on or when burst signal transmission starts. When the rise of the signal "a" is nearly complete, the present invention generates the control signal "c" according to the average value data "f" that corresponds to difference data obtained from a moving average of the difference between the detected level data "h" and the reference value data "g." The present invention thus stabilizes the level of the transmission output signal "b" from a first rise thereof. The present invention monitors a variation in the difference data, to update the average value data "f" used to generate the control signal "c." The present invention employs the smoothing unit 4 to smooth the difference between previous and current data to generate the control signal "c." The present invention thus removes the influence of a delay in the feedback loop for controlling the output signal "b" and stabilizes the operation of the output control unit 1.

What is claimed is:

1. An apparatus for stabilizing the level of an output signal by controlling an output control unit according to a control signal, comprising:

a switching unit having a first input to receive initial value data and a second input to receive average value data, the initial value data determining an initial value of the control signal when an input signal to the output control unit rises, the average value data being obtained from a moving average of the difference between reference value data and level data detected from the output signal of the output control unit after the input signal rises, said switching unit carrying out a switching from said initial value data to said average value data to be output from said switching unit when said moving average of the difference between the reference value data and the level data detected from the output signal of the output control unit becomes within a predetermined range; and a smoothing unit for smoothing the difference between the initial value data and the average value data both provided through the switching unit, for a predetermined period and generating the control signal for the output control unit accordingly.

2. The apparatus of claim 1, further comprising:

a level detecting unit for detecting the level of the output signal of the output control unit and providing the level data;

a difference detecting circuit for calculating a moving average of the difference between the level data and the reference value data or average value data and providing difference data;

a differential value detecting circuit for detecting a variation in the difference data and providing differential data;

the switching unit for switching the initial value data to the average value data when the differential data decreases below a predetermined value; and the smoothing unit for smoothing the difference between the initial value data and the average value data both provided through the switching circuit, for the predetermined period and generating the control signal for the output control unit accordingly.

3. The apparatus of claim 1, further comprising:

an average value data holding circuit for holding the difference data as the average value data; and the smoothing unit being provided with the average value data after the differential value detecting circuit determines that a variation in the difference data has increased above the predetermined value and then decreased below the predetermined value.

4. The apparatus of claim 1, wherein it is determined whether or not the average value data held in the average value data holding circuit and difference data that is provided by the difference detecting circuit after the predetermined period exceed a predetermined range, and if they exceed the predetermined range, setting the difference data as new average value data in the average value data holding circuit and providing the new average value data as current data to the smoothing unit.

5. The apparatus of claim 1, wherein the smoothing unit has:

a multiplier for multiplying the difference between previous and current data provided through the switching circuit by function data that changes during the predetermined period;

an adder for adding the product calculated by the multiplier to the previous data; and the output of the adder being provided to generate the control signal for the output control unit for the predetermined period, and after the predetermined period, the current data being provided to generate the control signal for the output control unit.

6. The apparatus of claim 5, further comprising:

a comparator for comparing the difference data from the difference detecting circuit with difference tolerance data, and if the difference data is above the difference tolerance data, controlling the switching means to provide the initial value data to the smoothing unit.

* * * * *